(12) United States Patent
Luh

(10) Patent No.: US 7,116,260 B2
(45) Date of Patent: Oct. 3, 2006

(54) MISMATCH SHAPED ANALOG TO DIGITAL CONVERTER

(75) Inventor: Louis Luh, San Gabriel, CA (US)

(73) Assignee: Raytheon Company, Waltham, MA (US)

( * ) Notice: Subject to any disclaimer, the term of this patent is extended or adjusted under 35 U.S.C. 154(b) by 19 days.

(21) Appl. No.: 11/043,512

(22) Filed: Jan. 26, 2005

(65) Prior Publication Data
US 2006/0164276 A1 Jul. 27, 2006

(51) Int. Cl.
*H03M 1/12* (2006.01)

(52) U.S. Cl. ........................ 341/155; 341/172

(58) Field of Classification Search ......... 341/155–172
See application file for complete search history.

(56) References Cited

U.S. PATENT DOCUMENTS

| | | | | |
|---|---|---|---|---|
| 5,099,240 A | * | 3/1992 | Nakatani et al. | 341/156 |
| 5,684,482 A | | 11/1997 | Galton | |
| 5,757,303 A | * | 5/1998 | Nakatani et al. | 341/159 |
| 6,459,399 B1 | * | 10/2002 | Nozaki | 341/155 |
| 6,518,898 B1 | * | 2/2003 | Choksi | 341/118 |
| 6,606,048 B1 | * | 8/2003 | Sutardja | 341/155 |
| 6,816,103 B1 | * | 11/2004 | Jonsson et al. | 341/160 |

OTHER PUBLICATIONS

Carley, L.R., Kenney, J.,"A 16-bit 4th order noise-shaping D/A Converter", Proc. IEEE Custom Integrated Circuits Conference, pp. 21.7/1-21.7/4, 1988.
Leung, B.H., Sutarja, S., "Multibit A/D converter incorporating a novel class of dynamic element matching techniques", IEEE Transactions on Circuits and Systems II: Analog and Digital Signal Processing, vol. 39, Issue: 1, Jan. 1992.

* cited by examiner

*Primary Examiner*—Lam T. Mai
(74) *Attorney, Agent, or Firm*—Leonard A. Alkov; Karl A. Vick

(57) ABSTRACT

A mismatch shaped analog to digital converter. The novel analog to digital converter includes a first circuit for providing a plurality of reference voltages, a plurality of comparators adapted to compare an input signal with the reference voltages, and a second circuit for randomizing connections between the reference voltages and the comparators. The connections are randomized such that noise caused by mismatch errors is spectrally shaped according to a desired noise-shaping characteristic. In an illustrative embodiment, the second circuit includes a noise-shaping circuit comprised of a plurality of Delta-Sigma modulators for generating one or more control signals, and a router for connecting the reference voltages to the comparators in accordance with the control signals. The mismatch shaped analog to digital converter can be used within a Delta-Sigma modulator to shape noise caused by mismatch errors in the feedback digital to analog converter.

17 Claims, 5 Drawing Sheets

MISMATCH SHAPED ANALOG TO DIGITAL CONVERTER

BACKGROUND OF THE INVENTION

1. Field of the Invention

The present invention relates to electronics and electrical systems. More specifically, the present invention relates to analog to digital converters.

2. Description of the Related Art

Analog to digital converters are widely used for converting analog signals to corresponding digital signals for many electronic circuits. For example, a high-resolution analog to digital converter (ADC) may find application in radar, missile, and communications systems. There are two basic techniques for performing analog to digital conversion: an open-loop technique and a feedback technique. An open-loop ADC generates a digital signal directly in response to an analog input signal. This approach uses precisely matched components (such as resistors and capacitors) to digitize the input signal. The resolution and accuracy of an open-loop ADC depend on a precise matching of these components. However, highly precise components are difficult to achieve using conventional integrated circuit processing techniques.

A Delta-Sigma ($\Delta\Sigma$) ADC (also known as a Sigma-Delta ADC) is a feedback type ADC that subtracts a feedback signal from the analog input signal to provide an error signal. The error signal is filtered and then quantized to form a digital output signal. The Delta-Sigma approach achieves high resolution by precise timing instead of by precisely matching components as in open-loop converters. The Delta-Sigma technique is therefore the preferred technique for many applications.

A Delta-Sigma ADC typically includes a Delta-Sigma modulator and a digital filter. The Delta-Sigma modulator (also known as a Sigma-Delta modulator) uses oversampling (i.e., a sampling rate above the Nyquist rate) and filtering to develop a high signal-to-noise ratio in the signal band. The digital filter then attenuates the out-of-band quantization noise and decimates the signal to provide an N-bit data word at the Nyquist rate.

A simple Delta-Sigma modulator includes a quantizer, an analog filter, and a digital to analog converter (DAC). The quantizer generates a digital output signal in response to the filtered difference between the analog input signal and a feedback signal. The feedback signal is the digital output signal reconverted to analog by the DAC. The analog filter shapes the quantization noise to be higher at frequencies outside of the signal band. The ADC digital filter typically has a lowpass characteristic with a cutoff frequency at the Nyquist frequency. Since the sampling frequency is much higher than the Nyquist frequency, the filter can usually attenuate this out-of-band quantization noise sufficiently.

High resolution and low distortion can be achieved by using a single-bit quantizer inside the Delta-Sigma modulator. However, single-bit Delta-Sigma ADCs are less stable, suffer from more quantization noise, and require a higher oversampling ratio (OSR, the ratio of the sampling rate to the signal bandwidth). By replacing the single-bit quantizer with a multi-bit ADC inside the loop, the Delta-Sigma ADC can use a lower sampling rate to achieve the same resolution with much better stability. However, due to the mismatch of elements inside the feedback DAC, multi-bit Delta-Sigma ADCs suffer from the non-linear distortion of the feedback DAC, which leads to poor resolution and high distortion in the overall ADC output. The most commonly used solution to this problem is to randomize the mismatch by dynamically swapping the elements inside the feedback DAC using a noise-shaped DAC.

The noise-shaped DAC approach inserts an extra noise-shaping circuit between the internal ADC and the feedback DAC in a multi-bit Delta-Sigma modulator to randomize the connections between the ADC and the DAC to spectrally shape the conversion noise generated by the mismatched components. The conversion noise can then be removed along with the quantization noise by the digital filter of the Delta-Sigma ADC. This noise-shaped DAC solution can minimize the non-linear distortion and in-band noise very effectively. However, the extra noise-shaping circuit which is inserted between the internal ADC and the feedback DAC causes a delay and therefore degrades the overall ADC performance. With the extra loop delay caused by the noise-shaping circuit, the Delta-Sigma ADC becomes more unstable. It requires effort to stabilize the system at the expense of lower overall resolution.

Hence, a need exists in the art for an improved system or method for reducing noise due to mismatch errors in a multi-bit Delta-Sigma ADC.

SUMMARY OF THE INVENTION

The need in the art is addressed by the mismatch shaped analog to digital converter of the present invention. The novel analog to digital converter includes a first circuit for providing a plurality of reference voltages, a plurality of comparators adapted to compare an input signal with the reference voltages, and a second circuit for randomizing connections between the reference voltages and the comparators. The connections are randomized such that noise caused by mismatch errors is spectrally shaped according to a desired noise-shaping characteristic. In an illustrative embodiment, the second circuit includes a noise-shaping circuit comprised of a plurality of Delta-Sigma modulators for generating one or more control signals, and a router for connecting the reference voltages to the comparators in accordance with the control signals. The mismatch shaped analog to digital converter can be used within a Delta-Sigma modulator to shape noise caused by mismatch errors in the feedback digital to analog converter.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
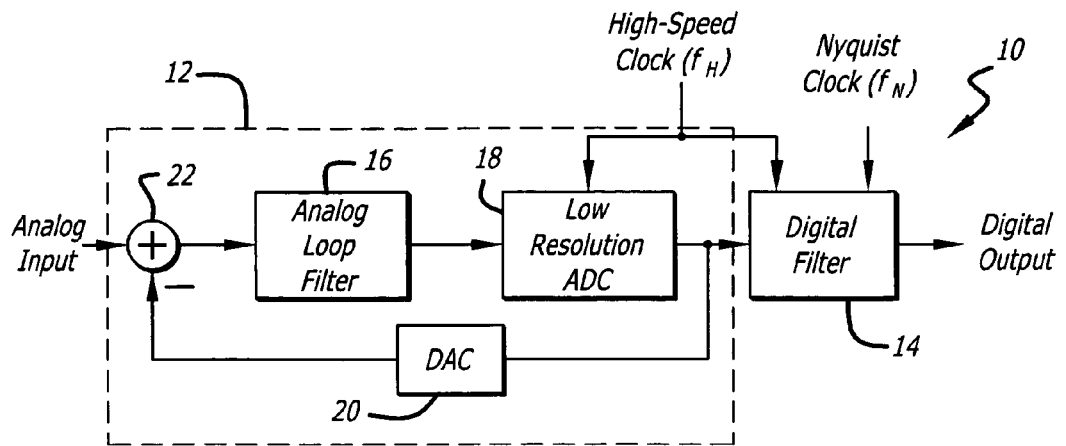
FIG. 1 is a simplified schematic of a conventional Delta-Sigma analog to digital converter.

FIG. 1 is a simplified schematic of a conventional Delta-Sigma analog to digital converter 10. The Delta-Sigma ADC 10 includes a Delta-Sigma modulator 12 and a digital filter 14. The simple Delta-Sigma modulator 12 typically includes an analog loop filter 14, a low resolution ADC or quantizer 18, and a digital to analog converter (DAC) 20. A summing node 22 subtracts the output of the DAC 20 from an analog input signal. The resulting signal is filtered by the loop filter 14, which shapes the quantization noise to be at frequencies outside of the signal band. The quantizer 18 then converts the filtered signal to a digital output signal at a sampling frequency that is much higher than the Nyquist frequency. The DAC 20 reconverts the digital output signal back to analog and feeds it back to the summing node 22. The digital output signal is also input to the digital filter 14. The digital filter 14 attenuates the out-of-band quantization noise and provides an N-bit data word at the Nyquist rate. A high-speed clock signal is input to the quantizer 18 and the digital filter 14, and a Nyquist clock signal is also input to the digital filter 14.

High resolution and low distortion can be easily achieved by using a single-bit ADC 18 inside the Delta-Sigma ADC 10 loop. However, single-bit Delta-Sigma ADCs are less stable, suffer from more quantization noise, and require a higher oversampling ratio. By replacing the single-bit ADC with a multi-bit ADC inside the loop, the Delta-Sigma ADC 10 can use a lower sampling rate to achieve the same resolution with much better stability. However, due to the mismatch of elements inside the feedback DAC 20, multi-bit Delta-Sigma ADCs suffer from the non-linear distortion of the feedback DAC, which leads to poor resolution and high distortion in the overall ADC 10 output. The most commonly used solution to solve this problem is to randomize the mismatch by dynamically swapping the elements inside the feedback DAC 20 by using a noise-shaped DAC.

Figure 2:
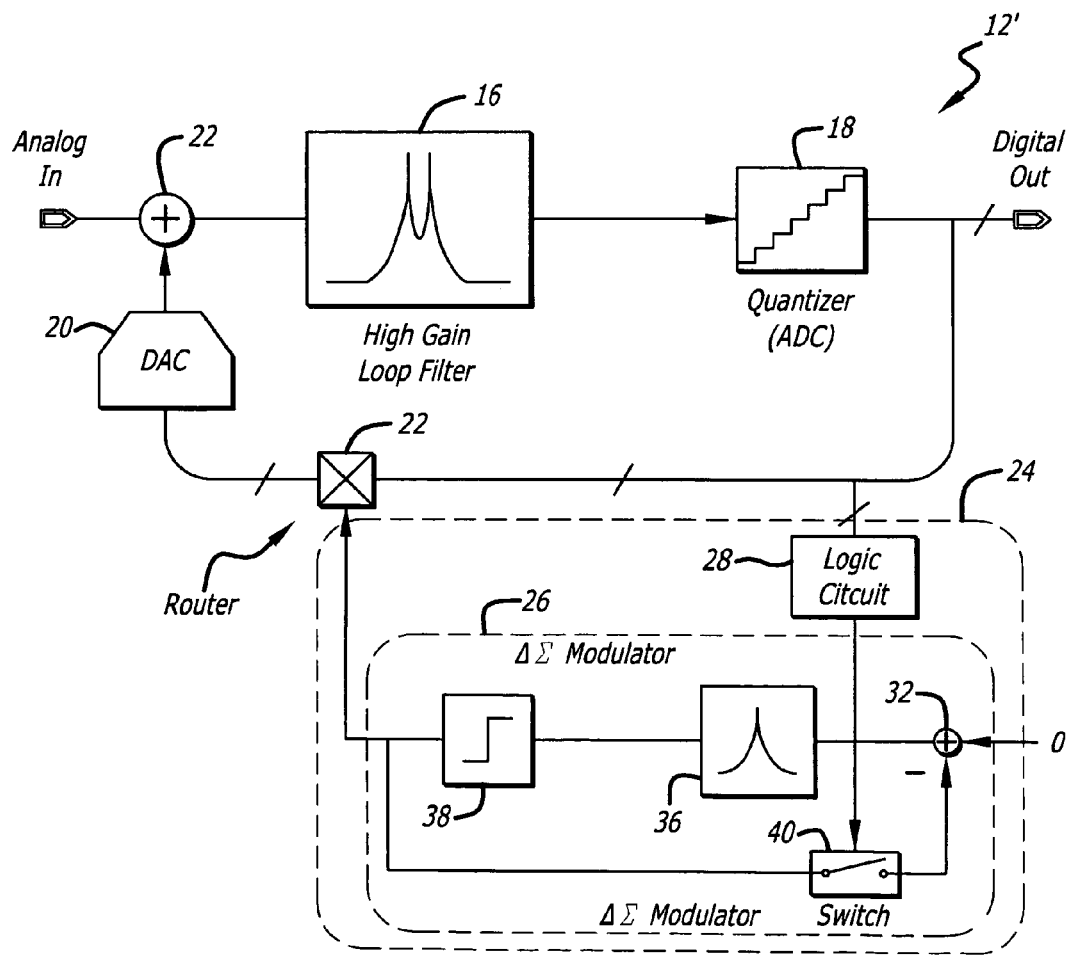
FIG. 2 is a simplified schematic of a conventional multi-bit Delta-Sigma modulator with a noise-shaped DAC.

FIG. 2 is a simplified schematic of a conventional multi-bit Delta-Sigma modulator 12' with a noise-shaped DAC. The Delta-Sigma modulator 12' is similar to that shown in FIG. 1, with the addition of a router 22 and a noise shaping circuit 24. A router 22 is inserted between the ADC 18 and the DAC 20 to dynamically swap the routing between the ADC 18 and the DAC 20 (the output from the ADC 18 is a digital output including a plurality of signals). A noise shaping circuit 24 including a logic circuit 28 and extra Delta-Sigma modulators 26 (only one Delta-Sigma modulator 26 is shown for simplicity) controls the router 22 to "shape" the noise and distortion caused by the mismatch out of the signal band. The internal Delta-Sigma modulator 26 includes a filter 36 and comparator 38. The outputs from the ADC 18 are input to a logic circuit 28, which controls a switch 40 in the Delta-Sigma modulator 26 connecting the output of the comparator 38 to a summing node 32. The logic circuit 28 may be implemented with a buffer and an XOR gate. The summing node 32 subtracts the output of the comparator 38 from an input signal, which in this case is zero, and inputs the result to the filter 36. The outputs from the internal Delta-Sigma modulators 26 control the router 22. A more detailed description of the noise-shaping circuit 24 and the noise-shaped DAC approach can be found in U.S. Pat. No. 5,684,482, entitled "Spectral Shaping of Circuit Errors in Digital-to-Analog Converters" by Ian Galton, the teachings of which are incorporated herein by reference.

This noise-shaped DAC solution can minimize the non-linear distortion and in-band noise very effectively. However, the router 22, which is inserted between the internal ADC 18 and the DAC 20, causes a delay and therefore degrades the overall ADC performance. With the extra loop delay caused by the router 22, the Delta-Sigma ADC becomes more unstable. It requires effort to stabilize the system at the expense of lower overall resolution.

The present invention solves this problem by introducing a mismatch shaped ADC, which can be used as the in-loop ADC 18 (instead of a conventional flash ADC) of a Delta-Sigma modulator 12 to shape the mismatch error of the internal feedback DAC 20. The novel ADC uses Delta-Sigma modulators to randomize the connections between the reference voltages and the comparators in a flash ADC according to the outputs of the ADC. This circuit assigns each comparator to compare a dynamically changed reference voltage to compensate the offsets and errors of each comparator. By noise shaping with several Delta-Sigma (DS) modulators in the loop, the quantization noise is minimized in the band of interest (signal band).

Figure 3:
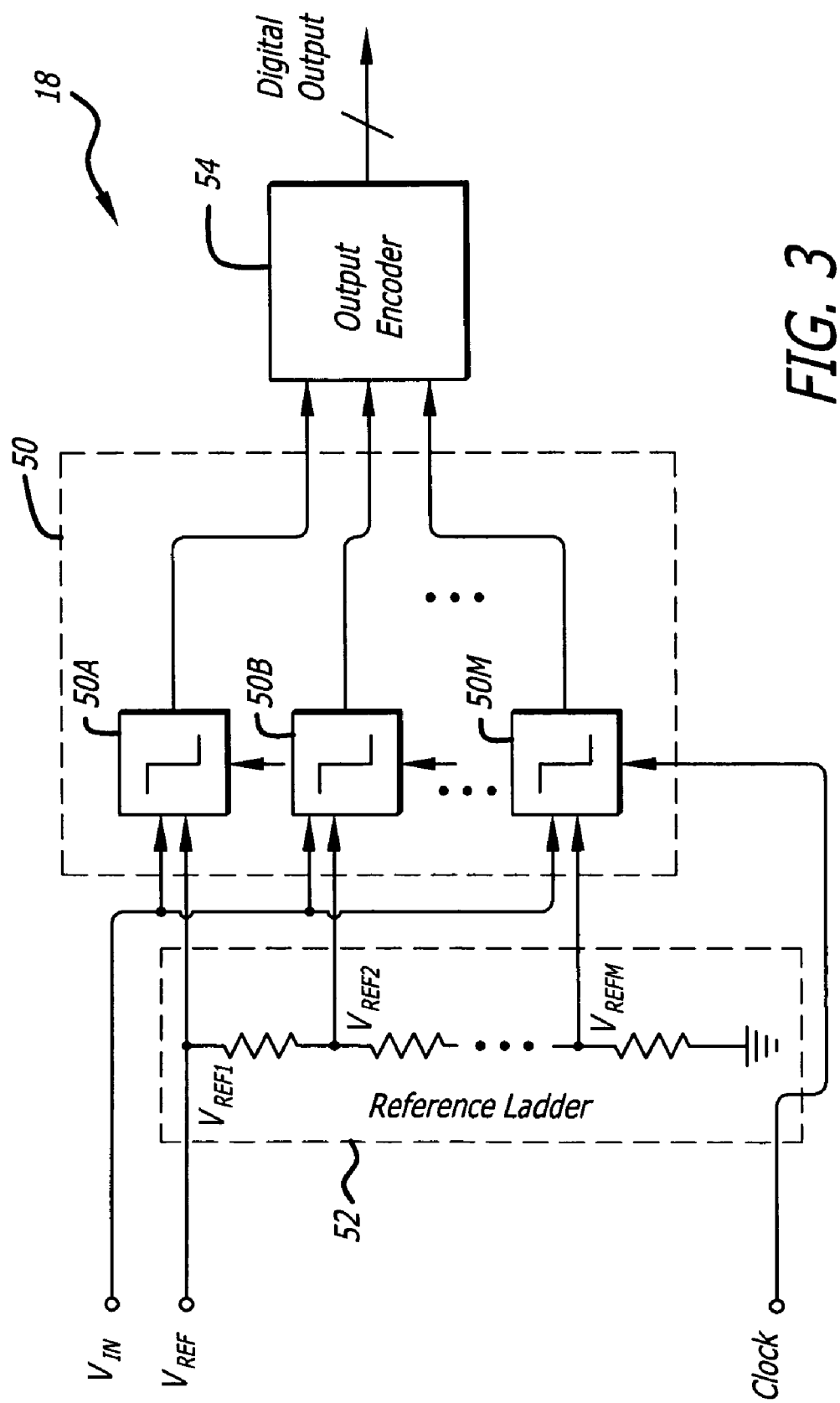
FIG. 3 is a simplified schematic of a conventional flash ADC.

FIG. 3 is a simplified schematic of a conventional flash ADC 18. A conventional flash ADC 18 includes a bank of comparators 50 (in FIG. 3, each individual comparator is labeled as 50A, 50B, ..., 50M) and a circuit, such as a resistor ladder 52, for generating a plurality of reference voltages $V_{REF1}, V_{REF2}, \ldots, V_{REFM}$. Each comparator 50$m$ compares the input signal $V_{IN}$ with a fixed reference voltage $V_{REFm}$ and outputs a 0 or 1, depending on whether the input was lower or higher than the reference voltage. The ADC 18 may also include an output encoder 54 for converting the outputs of the comparator bank 50 to a binary (or otherwise encoded) digital output. A clock signal is also input to each comparator 50$m$, and a reference voltage $V_{REF}$ is input to the resistor ladder 52.

Figure 4:
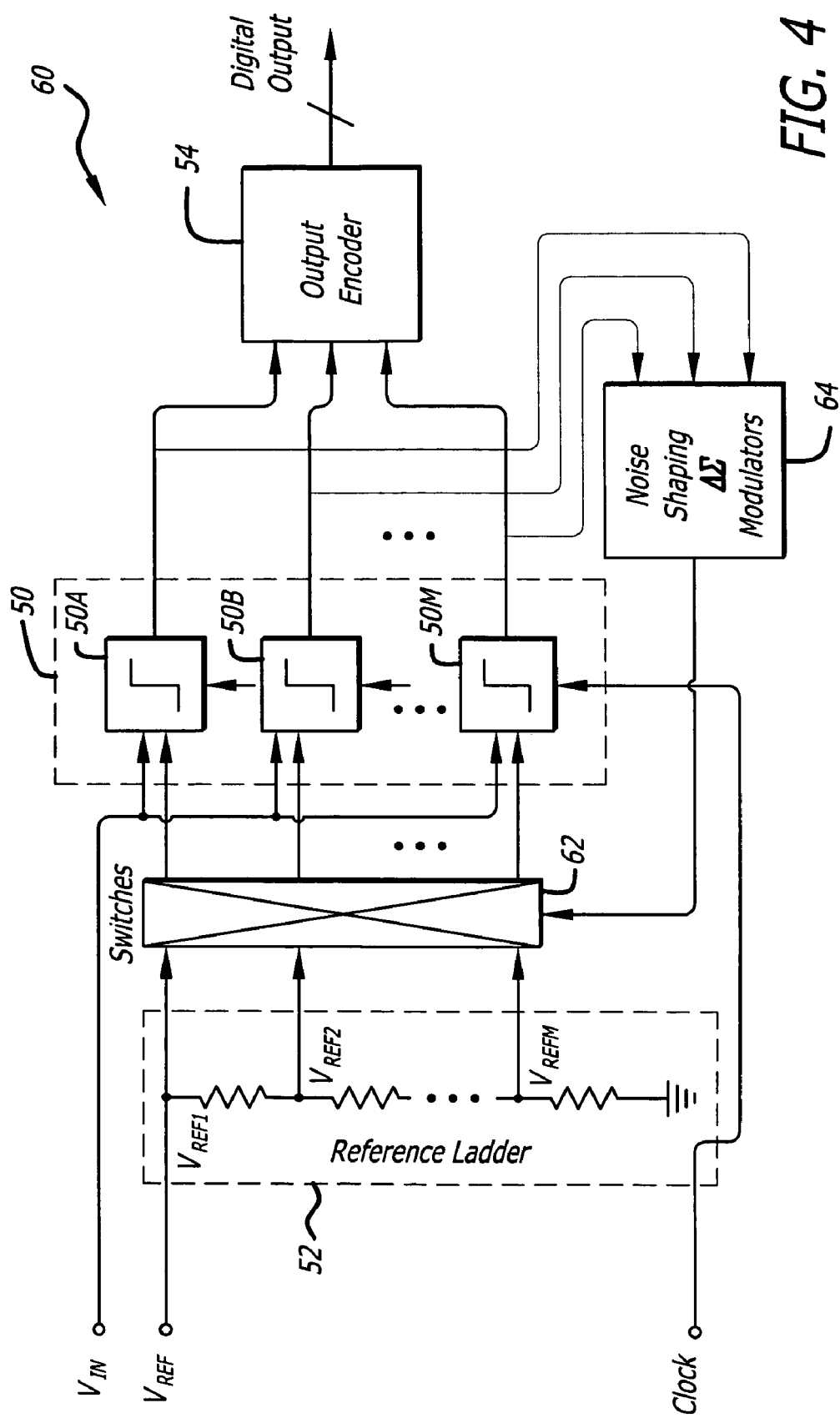
FIG. 4 is a simplified schematic of an illustrative embodiment of a noise-shaped ADC designed in accordance with the teachings of the present invention.

FIG. 4 is a simplified schematic of an illustrative embodiment of a noise-shaped (or mismatch shaped) ADC 60 designed in accordance with the teachings of the present invention. The ADC 60 is similar to that shown in FIG. 3, except for the addition of a router 62 and noise-shaping circuit 64. The router 62 dynamically swaps the connections between the reference ladder 52 and the comparators 50 in accordance with the outputs of the noise-shaping circuit 64. The noise-shaping circuit 64 receives the outputs of the comparator bank 50 and generates control signals for the router 62. Thus, instead of comparing the input signal to a fixed reference voltage, each comparator compares the input signal to a dynamically assigned reference voltage. This circuit can minimize the quantization noise (caused by mismatch of comparators for flash ADCs and by feedback DACs for Delta-Sigma ADCs) in the band of interest (signal band) by shaping the quantization noise of the ADC and moving the noise energy outside the signal band.

Figure 5:
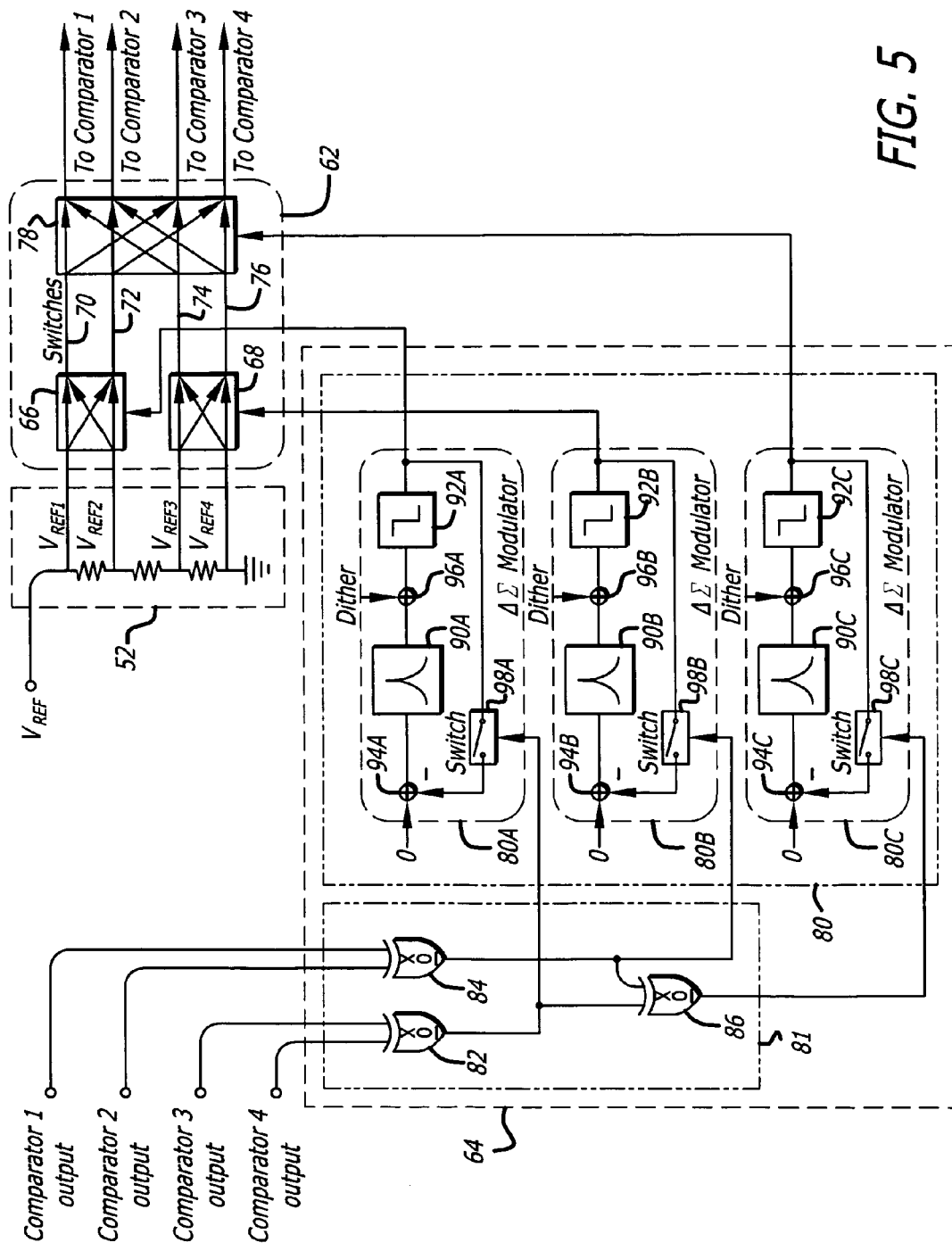
FIG. 5 is a simplified schematic showing the details of an illustrative noise-shaping circuit and router of a noise-shaped ADC designed in accordance with the teachings of the present invention.

FIG. 5 is a simplified schematic showing the details of an illustrative noise-shaping circuit 64 and router 62 for the noise-shaped ADC 60 of FIG. 4 designed in accordance with the teachings of the present invention. In this example, a 2.3-bit (5-level) noise-shaped ADC 60 having four comparators (50A, 50B, 50C, and 50D) is shown. This architecture can be easily extended for any higher (or lower) resolution ADC.

In the illustrative embodiment, the router 62 includes a plurality of switching blocks 66, 68, and 78. The first switching block 66 couples $V_{REF1}$ to a first node 70 and $V_{REF2}$ to a second node 72 during an "off" state. During an "on" state, the first switching block 66 couples $V_{REF1}$ to the second node 72 and $V_{REF2}$ to the first node 70. Similarly, the second switching block 68 couples $V_{REF3}$ to a third node 74 and $V_{REF4}$ to a fourth node 76 during an "off" state, and couples $V_{REF3}$ to the fourth node 76 and $V_{REF4}$ to the third node 74 during an "on" state. During an "off" state, the third switching block 78 couples the first node 70 to an input of the first comparator 50A, the second node 72 to an input of the second comparator 50B, the third node 74 to an input of the third comparator 50C, and the fourth node 76 to an input of the fourth comparator 50D. During an "on" state, the third switching block 78 couples the first node 70 to an input of the third comparator 50C, the second node 72 to an input of the fourth comparator 50D, the third node 74 to an input of the first comparator 50A, and the fourth node 76 to an input of the second comparator 50B. Thus, the router 62 determines which reference voltages are input to which comparators. The states of the switches 66, 68, and 78 are controlled by the noise-shaping circuit 64.

The noise-shaping circuit 64 is designed to randomize the connections in the router 62 such that noise (caused by mismatch errors in the comparators) is spectrally shaped according to a desired noise-shaping characteristic, such as minimized in the signal band. This can be accomplished using a bank of Delta-Sigma modulators 80. In the illustrative embodiment of FIG. 5, the noise-shaping circuit 64 includes a plurality of 1-bit Delta-Sigma modulators 80A, 80B, and 80C, and a logic circuit 81. The logic circuit 81 may be implemented with a buffer and an XOR gate. The output of the first Delta-Sigma modulator 80A controls the switch 66 in the router 62. The output of the second Delta-Sigma modulator 80B controls the switch 68, and the output of the third Delta-Sigma modulator 80C controls the switch 78.

Each Delta-Sigma modulator 80x includes a filter 90x and a 1-bit ADC or comparator 92x. The output of the comparator 92x is output from the Delta-Sigma modulator and also fed back to a first summing node 94x. The first summing node 94x subtracts the feedback signal from an input signal and feeds the result to the filter 90x. In this embodiment, the input to each Delta-Sigma modulator 80A, 80B, and 80C is zero. A dither signal can be added to a second summing node 96x placed between the filter 90x and the comparator 92x to ensure a non-zero output. A switch 98x is placed in the feedback path between the comparator 92x and first summing node 94x. The switches 98A, 98B, and 98C are controlled by the outputs of the logic circuit 81.

Offset errors due to mismatched comparators occur when two comparator outputs are different. The logic circuit 81 is therefore designed to turn on the feedback loops in the Delta-Sigma modulators whenever two outputs are different, and turn off the feedback loops when two outputs are the same. In the illustrative embodiment, the logic circuit 81 includes three XOR gates 82, 84, and 86. The first XOR gate 82 compares the outputs from the third comparator 50C and the fourth comparator 50D, and controls the switch 98A in the first Delta-Sigma modulator 80A. When both comparator outputs are the same, the XOR 82 causes the switch 98A to open, disconnecting the feedback loop in the Delta-Sigma modulator 80A. When the comparator outputs are different, the XOR 82 closes the switch 98A in the Delta-Sigma modulator 80A. Similarly, the second XOR gate 84 compares the outputs from the first comparator 50A and the second comparator 50B, and controls the switch 98B in the second Delta-Sigma modulator 80B. The third XOR gate 86 compares the outputs from the first XOR 82 and the second XOR 84, and controls the switch 98C in the third Delta-Sigma modulator 80C.

Thus, the router 62 and noise-shaping circuit 64 randomize the connections between the reference voltages and the comparators 50 such that noise due to mismatch errors is spectrally shaped in accordance with a desired noise-shaping characteristic. This type of circuit is particularly useful in a multi-bit Delta-Sigma ADC.

Figure 6:
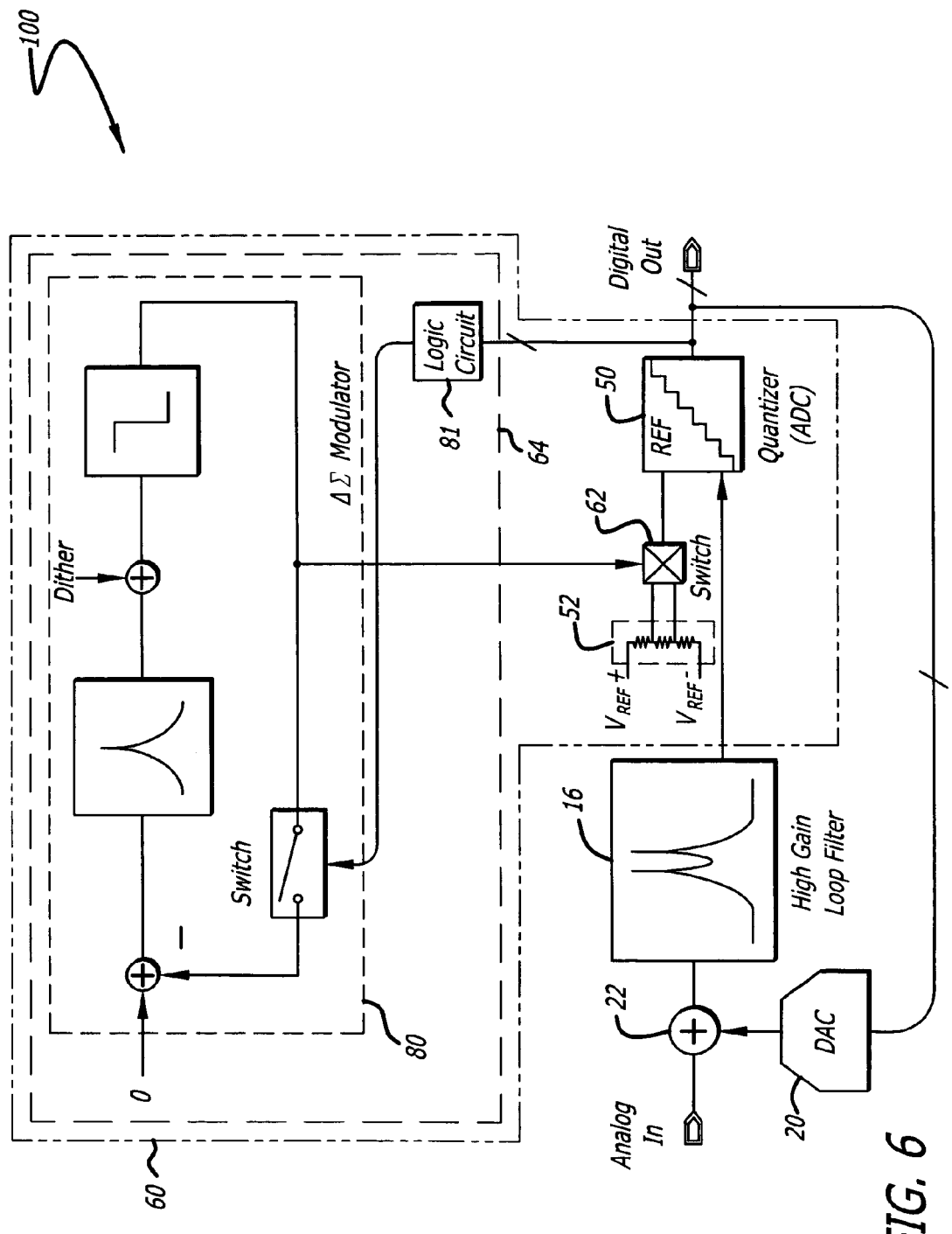
FIG. 6 is a simplified schematic of an illustrative multi-bit Delta-Sigma ADC with a mismatch-shaped ADC designed in accordance with the teachings of the present invention.

FIG. 6 is a simplified schematic of an illustrative multi-bit Delta-Sigma modulator 100 with a mismatch-shaped ADC 60 designed in accordance with the teachings of the present invention. The Delta-Sigma modulator 100 is similar that shown in FIG. 1 except that the quantizer 18 is replaced with the novel mismatch-shaped ADC 60 of the present invention. An analog input signal and a feedback signal from a DAC 20 are summed by a summing node 22 and input to a high gain loop filter 16. The output of the filter is input to the comparators 50 of the mismatch shaped ADC 60. The comparators 50 compare the signal with dynamically assigned reference voltages generated by a resistive ladder 52 and controlled by a router 62 and noise-shaping circuit 64. The outputs of the comparator 50 are then input to the feedback DAC 20. The noise-shaping circuit 64, which includes a logic circuit 81 and a bank of Delta-Sigma modulators 80 (only one Delta-Sigma modulator 80 is shown for simplicity) is designed to spectrally shape noise caused by mismatch errors in the feedback DAC 20, which is a significant source of noise and distortion in a Delta-Sigma modulator.

The multi-bit Delta-Sigma modulator 100 with the mismatch-shaped ADC 60 can achieve the same effect as the conventional Delta-Sigma modulator 12' with a mismatch-shaped DAC (shown in FIG. 2), but without the extra loop delay. In the prior art approach, the inputs to the DAC 20 were randomized by adding an extra circuit in the signal path between the quantizer and the DAC, resulting in an extra delay and degrading the overall performance of the multi-bit Delta-Sigma modulator. In the novel approach of the present teachings, the connections between the reference voltages and the comparators of the quantizer are randomized, which, in effect, randomizes the outputs of the comparators, which are the inputs to the DAC. The same effect is thus achieved without the extra delay. Therefore, with the use of the mismatch-shaped ADC 60 of the present invention, a multi-bit Delta-Sigma ADC can have very high resolution and very low distortion without the stability problem of prior art approaches.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. An analog to digital converter comprising:
   first means for providing a plurality of reference voltages;
   a plurality of comparators adapted to compare an input signal with said reference voltages; and second means for randomizing connections between said reference voltages and said comparators wherein said connections are randomized such that noise caused by mismatch errors is spectrally shaped according to a desired noise-shaping characteristic, and wherein said second means includes third means for generating one or more control signals, and fourth means for connecting said reference voltages to said comparators in accordance with said control signals.

2. The invention of claim 1 wherein said third means includes a noise-shaping circuit.

3. The invention of claim 2 wherein said noise-shaping circuit is adapted to receive output signals from said comparators and in accordance therewith generate said control signals.

4. The invention of claim 3 wherein said noise-shaping circuit includes a plurality of Delta-Sigma modulators.

5. The invention of claim 4 wherein each Delta-Sigma modulator includes a feedback path and a switch adapted to open and close said feedback path.

6. The invention of claim 5 wherein said noise-shaping circuit further includes one or mare logic circuits adapted to receive output signals from said comparators and in accordance therewith control said switches.

7. The invention of claim 6 wherein said logic circuits include XOR gates.

8. The invention of claim 7 wherein said XOR gates are adapted to close said feedback paths when two comparator outputs are different, and to open said feedback paths when two comparator outputs are the same.

9. The invention of claim 4 wherein each Delta-Sigma modulator has zero input.

10. The invention of claim 4 wherein said Delta-Sigma modulators are one-bit Delta-Sigma modulators.

11. The invention of claim 4 wherein said fourth means includes a router.

12. The invention of claim 11 wherein said router includes a plurality of switching blocks.

13. The invention of claim 12 wherein each Delta-Sigma modulator controls one of said switching blocks.

14. The invention of claim 1 wherein said first means includes a resistive ladder.

15. A noise-shaping analog to digital converter comprising:

a first circuit for providing a plurality of reference voltages;

a plurality of comparators adapted to compare an input signal with said reference voltages;

a router adapted to connect said reference voltages to said comparators in accordance with one or more control signals; and a noise-shaping circuit adapted to generate said control signals such that noise caused by mismatch errors is spectrally shaped according to a desired noise-shaping characteristic.

16. A multi-bit Delta-Sigma modulator comprising:

a summing circuit for generating a difference signal from an input signal and a feedback signal;

a filter adopted to receive said difference signal and output a filtered signal;

a circuit for generating a plurality of reference voltages;

a plurality of comparators adapted to compare said filtered signal with said reference voltages and output a plurality of digital output signals;

a digital to analog converter adapted to convert said digital output signals to analog to generate said feedback signal;

a router adapted to connect said reference voltages to said comparators in accordance with one or more control signals; and a noise-shaping circuit adapted to generate said control signals such that noise caused by mismatch errors in said digital to analog converter is spectrally shaped according to a desired noise-shaping characteristic.

17. A method for spectrally shaping noise due to mismatch errors in a multi-bit Delta-Sigma modulator including the steps of:

generating a difference signal from said input signal and a feedback signal;

filtering said difference signal to generate a filtered signal;

generating a plurality of reference voltages;

comparing said filtered signal with said reference voltages using a plurality of comparators to generate a plurality of digital output signals;

randomizing connections between said reference voltages and said comparators such that noise caused by mismatch errors is spectrally shaped according to a desired noise-shaping characteristic; and converting said digital output signals to analog to generate said feedback signal.

* * * * *